July 9, 1968 J. T. BAYLOR ET AL 3,392,347
METHOD FOR STABILIZING CENTER FREQUENCY
OF VOLTAGE CONTROL OSCILLATOR
Filed Sept. 7, 1965

INVENTOR.
JOHN THOMAS BAYLOR
WILLIAM L. BLAIR
JESS C. WRIGHT
Carl R. Brown
attorney United States Patent Office 3,392,347

Patented July 9, 1968

3,392,347

METHOD FOR STABILIZING CENTER FREQUENCY OF VOLTAGE CONTROL OSCILLATOR

John Thomas Baylor, San Diego, William L. Blair, Cardiff, and Jess C. Wright, San Diego, Calif., assignors to Cubic Corporation, San Diego, Calif., a corporation of California Filed Sept. 7, 1965, Ser. No. 485,503
4 Claims. (Cl. 331—22)

ABSTRACT OF THE DISCLOSURE

This method uses a center frequency stabilization loop to hold an oscillator to a center frequency where the oscillator is modulated with an input modulation that is primarily asymmetric, which input modulation can cause center frequency drift to the unbalanced side.

*Background of the invention*

The problem of stabilizing the center frequency of a voltage control oscillator has been one of long standing. With the increased narrowing of channels in the frequency modulation transmission bands, the requirement for improved center frequency stabilization has become more acute. For example, in meeting recently suggested new requirements for S-band telemetry, it will be necessary to develop a voltage controlled oscillator whose center frequency is accurate to within 0.005%. This exceeds the capability of the center frequency stabilization circuits known in the art.

In the past, voltage stabilization of the center frequency of a voltage controlled oscillator has been a problem where a high degree of stability is required. Long term center frequency drift is caused by the aging of circuit components, by temperature changes, by power supply variations, or because of other like reasons. In some applications, the problem of long term center frequency drift becomes particularly acute, such as, where the input modulation is primarily asymmetric. This causes the center frequency to drift over a period of time towards the unbalanced side. In frequency modulation applications, such as in telemetry, high angle modulation signals, such as pulse code or television, causes the modulation signal to continuously swing through several revolutions around the center frequency. This reduces the center frequency component of the spectrum to a magnitude that is difficult to detect and lock on. Thus in these environments it is difficult to stabilize the center frequency of the voltage control oscillator to that degree required to assure non-interference with other channels. In some telemetry applications using yes-no pulse code modulation, the center frequency becomes relatively so weak that it is not possible to detect it.

Further the problem of center frequency stability is that this parameter is not compatible with the wide frequency deviation capability required. While several other people have developed stabilization methods in which discriminators are used to detect the modulation and feed it back to control the center frequency, these prior developments present problems. If the discriminator feedback loop is tight and the bandwidth wide, then the modulation is partially wiped off. If the control loop is narrow band, then the stabilization is poor.

Because of the foregoing, it is therefore an object of this invention to provide a novel and improved center frequency stabilization circuit for a voltage control oscillator.

It is another object of this invention to provide an improved and novel voltage control oscillator, center frequency stabilization circuit that provides a high degree of center frequency stabilization for high frequency transmission.

It is another object of this invention to provide a voltage control oscillator, center frequency stabilization circuit capable of a high degree of center frequency stabilization where the input modulation is capable of creating asymmetric side bands.

It is another object of this invention to provide an improved and novel voltage control oscillator, center frequency stabilization circuit having a relatively simple circuit arrangement that is capable of protecting against long term drift as may be caused by aging of components, temperature changes, variation in power supply, or by asymmetric input modulating signals It is another object of this invention to provide a novel and improved voltage control oscillator, center frequency stabilization circuit that is capable of stabilizing to a high degree the center frequency, to predetermined and constant frequencies, in environments where the center frequencies of the voltage controlled oscillator output is relatively undetectable.

To accomplish this, the present invention in its basic form includes a voltage controlled oscillator with a center frequency stabilization loop connected around the oscillator. A portion of the voltage controlled oscillator output is extracted and modulated with a signal that has a frequency well above the maximum frequency of the desired modulation but well below the voltage control oscillator center frequency. This modulation may be called a second modulation by considering the modulating signal applied to the voltage controlled oscillator as being the first modulation. The second modulation may be either amplitude modulation or phase modulation. The second modulated signal is then mixed with a fixed or reference signal having a constant frequency to which the center frequency of the voltage controlled oscillator is to be stabilized. The output of the mixer thus contains the second modulation signal that is modulated by base band cross products. The products are eliminated passing only the side bands, which side bands are synthetic, symmetrical side bands created on a carrier that is indifferent to the first modulation. Thus the side bands are reconstructed about where the carrier should be. These side bands are then filtered; eliminating the unwanted signals and the second modulation signal plus the difference between the center frequency of the voltage controlled oscillator output and the frequency of the fixed or reference signal is applied to a synchronous detector. This double sideband suppressed carrier information is then compared with the second modulation signal and the difference between the uncorrected voltage controlled oscillator center frequency and the reference frequency is passed on as a control voltage to the voltage control oscillator. Should there be no amplitude or phase difference between the two signals or frequencies, then the output control voltage supplied to the voltage control oscillator by the stabilizing circuit will be zero.

Accordingly, the present invention provides circuitry wherein a wide band modulation, voltage controlled oscillator without center frequency stabilization is stabilized or phase locked to a given constant, predetermined frequency even though the voltage control oscillator may be subject to long term drift.

The above as well as other features of the present invention may be more clearly understood by reference to the drawing wherein.

Figure 1:
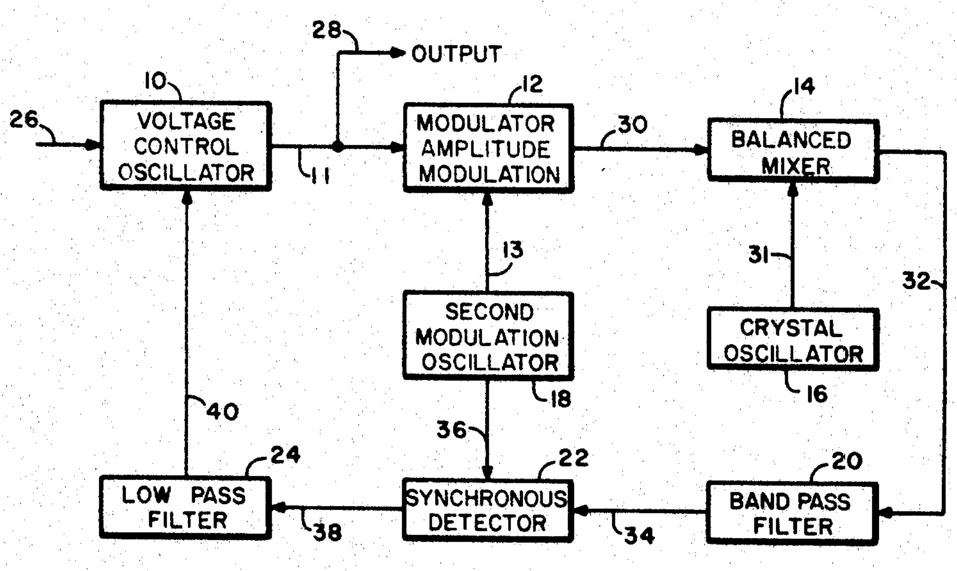
FIGURE 1 represents in block diagram form a preferred embodiment of this invention wherein amplitude modulation is used in the stabilizing circuit.

With reference to FIGURE 1, a voltage control oscillator 10 that is capable of wide band modulation is modulated by a first input modulating signal applied to line 26. The voltage control oscillator may be of the reactance tube type or utilize varicaps or the like that accepts control voltages to control the center frequency. The circuit of this invention is primarily direct FM and accordingly the output in line 28 may be amplified or multiplied for transmission purposes as desired.

To explain the circuit of this invention and establish an informative relationship about the frequency of signals within the circuit, a representative embodiment may have the following parameters.

The input modulation or first modulation in line 26 may have frequency components from zero frequency to 3 megacycles per second. The nominal center frequency of the voltage controlled oscillator 10 may be in the order of 50 megacycles per second to 260 megacycles per second. For VHF telemetry, the output of the voltage control oscillator 10 would be used directly for L (1435–1535 mc.) or S (2200–2300 mc.) band telemetry. The output of the voltage control oscillator would be multiplied by the proper value to provide the required output frequency.

A portion of the voltage control oscillator output or frequency $f_{vco}$ is applied through line 11 to the modulator 12. A second modulating oscillator 18 provides an output signal $f_1$ that may be in the order of 10 megacycles per second. The frequency of signal $f_1$ should be maintained at some frequency above the frequency band of the input modulation or above 3 megacycles. Modulator 12 amplitude modulates $f_{vco}$ with signal $f_1$. The modulator 12 in this embodiment of FIGURE 1 may be an absorption modulator wherein the amplitude of $f_{vco}$ is made to vary as a function of $f_1$. The modulator output includes the side bands of signals $f_{vco}$ plus $f_1$ or less $f_1$, and $f_{vco}$ and $f_1$.

The modulated output from modulator 12 is applied via line 30 to the balanced mixer 14. The crystal oscillator 16 provides a fixed or reference output signal $f_o$ having a standard constant frequency. Since it is an objective of this stabilizing circuit that the center frequency of the voltage controlled oscillator output have the same frequency as $f_o$, a comparison is made by supplying signal $f_o$ via line 31 to mixer 14. $f_o$ is mixed in the balanced mixer 14 with the output of modulator 12 and this mixing of signal $f_o$ with the signal $f_{vco}$ as modulated by the signal $f_1$ cancels out the input signal. Thus $f_{vco}$ and $f_1$ are eliminated leaving only the side bands, which are synthetic symmetrical side bands. The side bands are thus reconstructed to be symmetrical around where the carrier should be even though the input modulation may be such as to reduce or eliminate the carrier. The balance mixer functions to establish the difference between signal $f_{vco}$ and signal $f_o$ so this difference can be passed back to the voltage controlled oscillator as a control voltage. It may be seen that the modulator 12 and balanced mixer 14 create a set of controlled side bands that reconstruct the carrier even when it is difficult or impossible to detect a carrier frequency.

The output of the balance mixer 14 is applied through line 32 to the band pass filter 20. The band pass filter has a frequency band that brackets the frequency of signal $f_1$. Thus filter 20 passes only the modulating signal $f_1$ plus or minus the difference between $f_{vco}$ and $f_o$. The band width of the band pass filter determines the amount that the voltage control oscillator center frequency can be varied and still be stabilized by being locked into the stabilization circuit. The output of the band pass filter is then applied through line 34 to the synchronous detector 22.

The modulating frequency $f_1$ generated by the second modulating oscillator 18 is, in this amplitude modulation embodiment, applied through line 36 to the synchonous detector 22. The synchronous detector in effect cancels that signals $f_1$ and passes a direct current voltage to the low pass filter that varies in magnitude in direct proportion to the difference in frequency between signals $f_{vco}$ and $f_o$. The low pass filter, filters out other extraneous unwanted portions of the signal and applies the control voltage through line 40 to the voltage controlled oscillator. The low pass filter 24 may have a frequency band in the order of 10 to 100 cycles per second.

*Operation of the embodiment of FIGURE 1*

In operation, a modulating signal that may be in the order of zero to 3,000 kilocycles per second and may comprise pulse code or television modulating, is applied to the voltage control oscillator 10. The output of the voltage control oscillator is passed through line 28 to an output such as a transmitter or the like. A portion of the voltage control oscillator output or frequency $f_{vco}$ is applied to modulator 12. Modulator 12 modulates signal $f_{vco}$ with a second modulating frequency $f_1$ that may be in the order of 10 megacycles per second. The output of the modulator is then applied through line 30 to the balance mixer 14 where a crystal oscillator generated frequency $f_o$, having the desired frequency of the voltage control oscillator, is mixed with the composite signal in line 30. The mixer 14 applies the side bands, which have been synthetically created around a desired carrier frequency, to the band pass filter 20. The band pass filter filters out all portions of the signal other than $f_1$ as modified by the difference between $f_{vco}$ and $f_o$. The double sideband suppressed carrier output of the band pass filter is then applied to the synchronous detector where the signal $f_1$ is demodulated and a control voltage output corresponding to the difference between the center frequency of $f_{vco}$ and $f_o$ is passed through a low pass filter and as a direct current control voltage is applied to the voltage control oscillator 10. If the frequency $f_{vco}$ is higher or lower than the frequency $f_o$, then the control voltage will be of such magnitude and polarity as to correct the output frequency of the voltage control oscillator to a level corresponding to the frequency of $f_o$.

Figure 2:
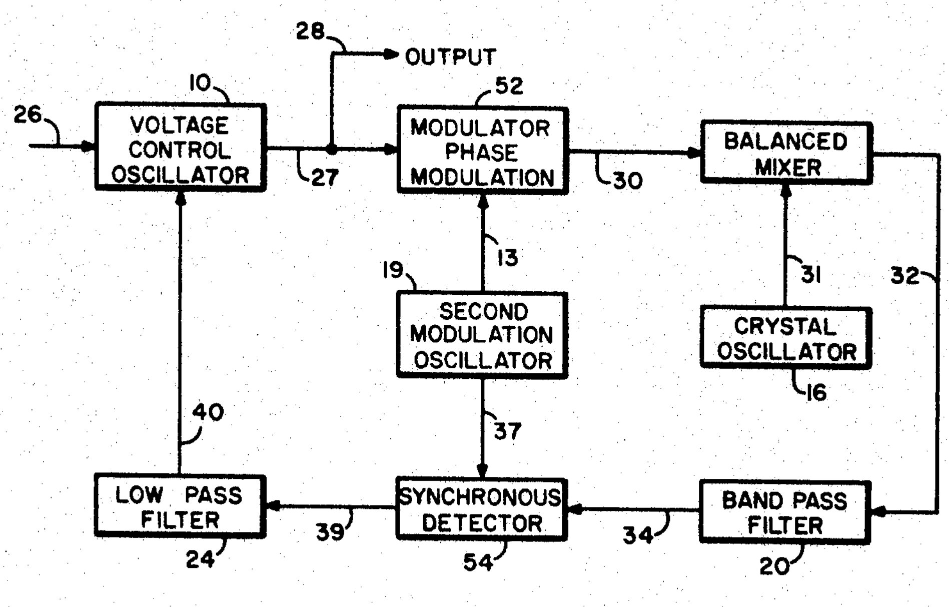
FIGURE 2 represents in block diagram form a preferred embodiment of the present invention in which phase modulation is used in the stabilizing circuit.

Referring now to FIGURE 2, the circuit embodiment in FIGURE 2 is essentially the same as the embodiment in FIGURE 1, except that the stabilizing circuit uses phase modulation instead of amplitude modulation. The signal $f_{vco}$ is applied to the phase modulation, modulator 52 through line 27, and this signal is modulated by the output of the second modulator oscillator 19 or modulating signal $f_1$. In phase modulator 52, the phase signal $f_{vco}$ is changed by the phase of signal $f_1$. It will become evident that in this embodiment, the phase of the signal varies while the amplitude remains constant. The balanced mixer and the crystal oscillator output $f_o$ function substantially the same as in FIGURE 1. The band pass filter 20 also functions in the same manner as in FIGURE 1, with the output of the band pass filter or signal $f_1$ plus or minus the phase difference between $f_{vco}$ and $f_1$ being applied to the synchronous detector 54 through line 34. The synchronous detector 54 demodulates the signal from the band pass filter with signal $f_1$ from the second modulator oscillator 19. The output signal is then applied to the low pass filter through line 29 with a direct current voltage level that reflects the frequency and/or phase variation between $f_{vco}$ and $f_o$. In both embodiments, the signal on line 34 consists of double sideband suppressed carrier information. The output of the synchronous detector will go to zero if and only if the phase difference between the signals on lines 11 and 32 in FIGURE 1 is 90°, or if the phase difference between the signals on lines 27 and 31 in FIGURE 2 is 0°.

For a better understanding of the invention, the following derived vector analysis of the embodiment of FIGURE 2 is given.

Referring now to FIGURE 2, the signal $f_{vco}$ is $$e_1=A_1 \cos \omega_v t+m \cos \omega_m t+\phi \quad (1)$$

where $\omega_v$ is a radian frequency of the $f_{vco}$, $m$ is the modulation index, $\omega_m$ is the radian frequency of the modulation, and $\phi$ is the phase of $f_{vco}$. This signal $f_{vco}$ is the output signal and $\omega_v$ is the frequency to be controlled. Signal $f_{vco}$ is modulated in the second modulator, which may be either amplitude modulation or phase modulation and in this analysis is phase modulation. To simplify this analysis the basic modulation is ignored and $f_{vco}$ is treated as though it were a fixed frequency, however, effects of the basic modulation will be examined later. The output of the second modulator, on this basis, is $$e_2=A_2 \cos(\omega_v t+\phi)+m'A_2 \cos \omega_1 t(\cos \omega_v t+\phi+90°) \quad (2)$$

where $m'$ is the second modulation index, substantially less than one, and $\omega_1$ is the radian frequency of the second modulation which is set high with respect to the allowable deviation of the center frequency of the voltage control oscillator. The basis for expression (2) is that the low index phase modulation may be represented by the summation of a carrier and a set of double sideband suppressed carrier signals added in quadrature.

Expanding (2) results in the following Equation 3.

$$e_2=A_2 \cos(\omega_v t+\phi)+(m'A_2/2) \cos(\omega_v t+\omega_1 t+\phi+90°)+(m'A_2/2) \cos(\omega_v t-\omega_1 t+\phi+90°) \quad (3)$$

The signal is then mixed with the output of the crystal oscillator 16 at a radian frequency $\omega_o$. This is the frequency to which the voltage control oscillator frequency, $\omega_v$, is to be locked. The output of the mixer is given by the following Equation 4.

$$\begin{aligned} e_3=&A_3 \cos(\omega_v t-\omega_o t+\phi)+A_3 \cos(\omega_v t+\omega_o t+\phi) \\ &+(m'A_3/2) \cos(\omega_v t-\omega_o t-\omega_1 t+90°+\phi) \\ &+(m'A_3/2) \cos(\omega_v t+\omega_o t-\omega_1 t+\phi+90°) \\ &+(m'A_3/2) \cos(\omega_v t-\omega_o t+\omega_1 t+\phi+90°) \\ &+(m'A_3/2) \cos(\omega_v t+\omega_o t+\omega_1 t+\phi+90°) \end{aligned} \quad (4)$$

The rather complex spectrum of the balanced mixer output is then filtered to extract the components that are at or near $\omega_1$. Since $\omega_v$ and $\omega_o$ are nearly equal, those terms that contain their difference come through the filter, while those that contain their sum do not. This results in an output spectrum at the filter of the form of Equation 5.

$$e_4=A_4 \cos(\omega_v t-\omega_o t-\omega_1 t+\phi+90°)+A_4 \cos(\omega_v t-\omega_o t+\omega_1 t+\phi+90°) \quad (5)$$

It may be seen that the form of the spectrum in Equation 5 is that of a double sideband suppressed carrier signal that can be rewritten as Equation 6.

$$e_4+A_4 \cos(\omega_v t-\omega_o t+\phi+90°) \cos \omega_1 t \quad (6)$$

In the phase detector, the spectrum of Equations of 5 and 6 is mixed with a signal of the form of Equation 7.

$$e_5=A_5 \cos \omega_1 t \quad (7)$$

The phase detector produces th product of $e_4$ and $e_5$, that gives $$e_6=A_6 \cos(\omega_v t-\omega_o t+\phi+90°) \quad (8)$$

The low pass filter provides a direct current signal to control the voltage control oscillator and phase. This direct current signal will go to zero if and only if $e_6$ goes to zero, which will occur when $\omega_v=\omega_o$ and when $\phi=0$. If it is necessary to hold an error signal to force the frequency to the proper value, then $\phi\neq0$, but the frequencies will still be exactly equal. If amplitude modulation is used, the frequencies will be equal, and a phase shift of 90° is necessary to get the cosine function to vanish.

Having initially ignored the effect of $\omega_m$ during the derivation of the lock function, it is necessary to go back and put it in to make this derivation complete. The effect of the basic modulation will depend on the modulation index, $m$, which is also the angle through which the carrier is rotated by the modulating signal. The output of the balanced mixer varies in amplitude as the phase of the voltage control oscillator output is varied, but this can be looked at as a secondary modulation on the $\omega_1$ signal at the input to the phase detector. Since the second modulation $\omega_1$ is high with respect to the allowable deviation, the modulation on the voltage control oscillator will show up as amplitude modulation on the $\omega_1$ at the phase detector input. This amplitude modulation will average out in the low pass filter for high modulation frequencies. When the voltage control oscillator normal center frequency does not require a direct current component, then the effect of modulation drops out as well.

Obviously many modifications and variations of the present invention as possible in light of the above teachings. It is therefore to be understood that within the scope of the appended claims the invention may be practiced otherwise than as specifically described. What we claim as new and desire to be secured by Letters Patent is:

1. The method of stabilizing the center frequency of an oscillator output where the oscillator is modulated by an input signal that is primarily asymmetric comprising the steps of,
   - modulating the oscillator with an input signal that is primarily asymmetric providing a first output,
   - modulating said first output with a second modulating signal that has a frequency higher than said input signal providing a second output,
   - mixing said second output with a fixed frequency signal,
   - filtering said second output plus the frequency difference between said second output and the fixed frequency signal,
   - developing a control voltage magnitude proportional to said frequency difference by detecting with said second modulating signal,
   - and applying said control voltage magnitude to said oscillator.

2. The method of stabilizing the center frequency of an oscillator output where the oscillator is modulated by an input signal that is primarily asymmetric comprising the steps of,
   - modulating the oscillator with a first signal that is primarily asymmetric providing a first output,
   - modulating said first output with a second modulating signal that has a frequency higher than said input signal providing a second output,
   - mixing said second output with a fixed frequency and developing symmetrical synthetic side bands around the fixed frequency,
   - filtering the side bands with a band bracketing said second output plus the frequency difference between said second output and said fixed frequency signal providing a double side band suppressed carrier output,
   - demodulating said double side band suppressed carrier output with said second modulating signal providing a control voltage output magnitude proportional to said frequency difference,
   - and applying said control voltage magnitude to said oscillator.

3. The method of stabilizing the center frequency of an oscillator output where the oscillator is modulated by an input signal that is primarily asymmetric comprising the step of,
   - modulating the oscillator with an input signal that is primarily asymmetric providing a first output,
   - amplitude modulating said first output with a second modulating signal having a given phase and having a frequency higher than said input signal providing a second output,
   - mixing said second output with a fixed frequency signal, filtering said second output plus the frequency difference between said second output and the fixed frequency signal, developing a control voltage magnitude proportional to said frequency difference by detecting with said second modulating signal being 90° out of phase with said given phase, and applying said control voltage magnitude to said oscillator.

4. The method of stabilizing the center frequency of an oscillator output where the oscillator is modulated by an input signal that is primarily asymmetric comprising the steps of, modulating the oscillator with an input signal that is primarily asymmetric providing a first output, moduating said first output with a second modulating signal that has a frequency higher than said input providing a second output, comparing said second output with a fixed frequency signal, filtering said second output plus the frequency difference between said second output and the fixed frequency signal providing a double side band suppressed carrier output, demodulating said double side band suppressed carrier output with said second modulating signal providing a control voltage output magnitude proportional to said frequency difference, and applying said control voltage magnitude to said oscillator.

References Cited

UNITED STATES PATENTS 2,917,713 12/1959 Grauling .......... 331—22 X

OTHER REFERENCES

Cutler: "Locked Oscillators For Test Equipment," Tele-Tech & Electronic Industries, August 1954.

Ryder: Electronic Fundaments and Applications, second edition, 1959, Prentice-Hall, Inc., Englewood Cliffs, N.J., pp. 475, 476.

ROY LAKE, *Primary Examiner.*

JAMES B. MULLINS, *Examiner.*